(12) United States Patent
Song et al.

(10) Patent No.: US 7,057,420 B2
(45) Date of Patent: Jun. 6, 2006

(54) SEMICONDUCTOR DEVICE HAVING SENSE AMPLIFIER DRIVER WITH CAPACITOR AFFECTED BY OFF CURRENT

(75) Inventors: Tae-joong Song, Gyeonggi-do (KR); Tae-hyoung Kim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/873,943

(22) Filed: Jun. 22, 2004

(65) Prior Publication Data

US 2005/0104627 A1   May 19, 2005

(30) Foreign Application Priority Data

Nov. 17, 2003  (KR) .................. 10-2003-0081109

(51) Int. Cl.
 *G11C 7/00* (2006.01)
(52) U.S. Cl. ........................................ 327/51; 365/205
(58) Field of Classification Search .................. 327/51; 365/205
See application file for complete search history.

(56) References Cited

U.S. PATENT DOCUMENTS

| | | | |
|---|---|---|---|
| 6,490,214 B1 * | 12/2002 | Kawasumi | 365/210 |
| 6,525,979 B1 * | 2/2003 | Kato | 365/210 |
| 6,738,296 B1 * | 5/2004 | Sung et al. | 365/189.07 |
| 6,804,153 B1 * | 10/2004 | Yoshizawa et al. | 365/189.07 |
| 6,831,853 B1 * | 12/2004 | Lin et al. | 365/154 |

\* cited by examiner

*Primary Examiner*—My-Trang Nu Ton
(74) *Attorney, Agent, or Firm*—Mills & Onello LLP

(57) ABSTRACT

A semiconductor device having a sense amplifier driver with a capacitor affected by off current is provided. The sense amplifier driver, which receives a clock signal and generates a sense amplifier enable signal by buffering the clock signal, includes a plurality of inverters connected in series and at least one capacitor. A PMOS transistor of at least a first inverter of the plurality of inverters is connected between a dummy bit line, in which voltage drop by the off current is generated, and the output terminal of the first inverter and the at least one capacitor is connected between the dummy bit line and the output terminal of a second inverter which inverts an output signal of the first inverter. Therefore, the capacitance of the at least one capacitor is determined by voltage of the dummy bit line. Therefore, since the voltage drop of the dummy bit line is larger when the magnitude of the off current is larger, the capacitance of the at least one capacitor is larger. Therefore, active timing of the sense amplifier enable signal is determined according to the capacitance of the capacitor.

4 Claims, 7 Drawing Sheets

SEMICONDUCTOR DEVICE HAVING SENSE AMPLIFIER DRIVER WITH CAPACITOR AFFECTED BY OFF CURRENT

BACKGROUND OF THE INVENTION

This application claims priority from Korean Patent Application No. 2003-81109, filed on Nov. 17, 2003, in the Korean Intellectual Property Office, the contents of which are incorporated herein in their entirety by reference.

1. Field of the Invention

The present invention relates to a semiconductor device, and more particularly, to a semiconductor device having a sense amplifier driver including a metal oxide semiconductor (MOS) capacitor affected by the off current of a semiconductor device manufactured under a high temperature by a fast manufacturing process.

2. Description of the Related Art

FIG. 1 is a conventional memory cell used in a semiconductor memory device. With reference to FIG. 1, the memory cell 10 is made up of a transistor 11 and a capacitor 12.

In general, the gate of the transistor 11 is connected to a word line WL, one terminal of the transistor 11 is connected to a bit line BL, and the capacitor 12 to store data is connected between the other terminal of the transistor 11 and the ground voltage VSS.

As deep submicron technology continues to be developed, the threshold voltage of transistors such as the one used as the transistor 11 is getting lower, thus improving the performance thereof. The performance of the transistor 11 can be expressed by the amount of current Idsat that the transistor 11 can conduct in a turn-on state.

If the threshold voltage of the transistor 11 is lower, the amount of current Idsat that the transistor 11 can conduct in the turn-on state (hereinafter, on current) increases. However, the amount of leakage current Ioff conducting in the transistor 11 in a turn-off state (hereinafter, off current) increases.

In general, the off current Ioff changes according to the manufacturing temperature, the voltage, and the manufacturing process. The manufacturing process includes a fast process and a slow process. For example, a transistor in which the on current Idsat is large can be manufactured by a fast process and a transistor in which the on current Idsat is small can be manufactured by a slow process.

However, under specific conditions (for example, a high manufacturing temperature and fast manufacturing process), the off current off increases so much that the on current Idsat is affected. Particularly, in an array including a plurality of memory cells, the merit obtained by lowering the threshold voltage of the memory cell dramatically decreases due to the decrease in the difference between the on current Idsat and the off current Ioff in the high manufacturing temperature and fast manufacturing process conditions.

When a memory device having a memory cell is designed, the amount by which the threshold voltage of the memory cell can be lowered is limited by the off current.

SUMMARY OF THE INVENTION

The present invention provides a semiconductor device having a sense amplifier driver including a MOS capacitor affected by the off current of a semiconductor device manufactured under a condition where the off current dramatically increases as a result of lowering the threshold voltage of a memory cell. An example of conditions that increase the threshold voltage include a high temperature and fast process.

According to an aspect of the present invention, there is provided a semiconductor device including: a sense amplifier for sensing a voltage difference between a bit line and a complementary bit line; a sense amplifier driver for receiving a clock signal and generating a sense amplifier enable signal by buffering the clock signal, in order to enable the sense amplifier; and a dummy bit line where voltage drop is generated due to an amount of off current of at least one transistor. The sense amplifier driver includes: a plurality of inverters connected in series and at least one capacitor. At least a first inverter of the plurality of inverters connected in series outputs a signal swinging between a voltage of the dummy bit line and a ground voltage. The at least one capacitor is connected between the dummy bit line and the output terminal of a second inverter which inverts an output signal of the first inverter.

In one embodiment, the first inverter is made up of a PMOS transistor and an NMOS transistor connected in series. The PMOS transistor can be connected between the dummy bit line and the output terminal of the first inverter, and the NMOS transistor can be connected between the output terminal of the first inverter and the ground voltage.

In one embodiment, the time taken for the voltage of the output terminal of the second inverter to transit from a power supply voltage to the ground voltage is determined by the capacitance of the capacitor. The capacitor can be realized by an NMOS transistor.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
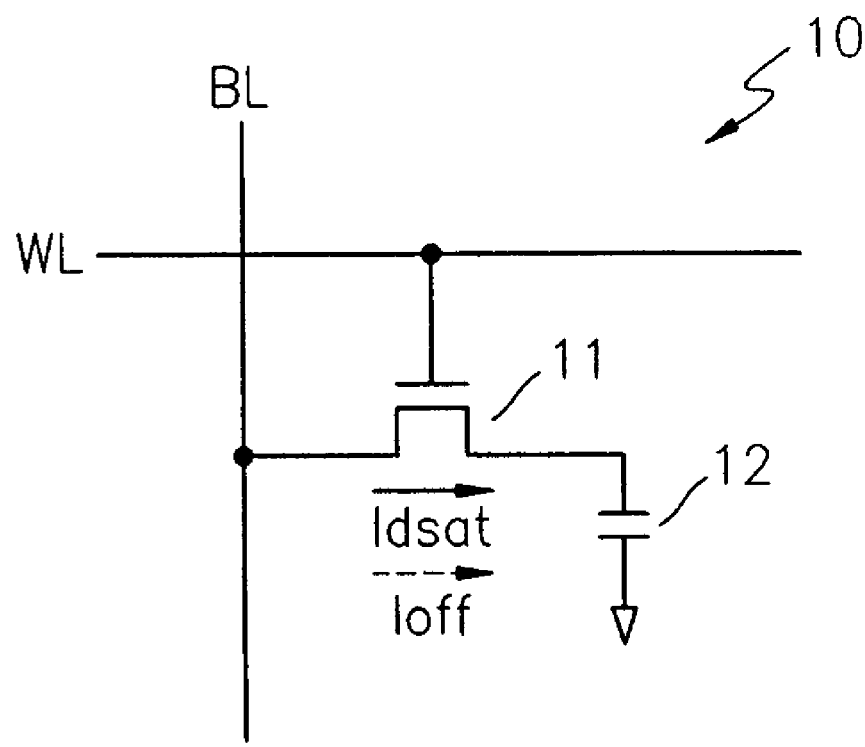
FIG. 1 is a diagram of a conventional memory cell used in a semiconductor memory device.
Figure 2:
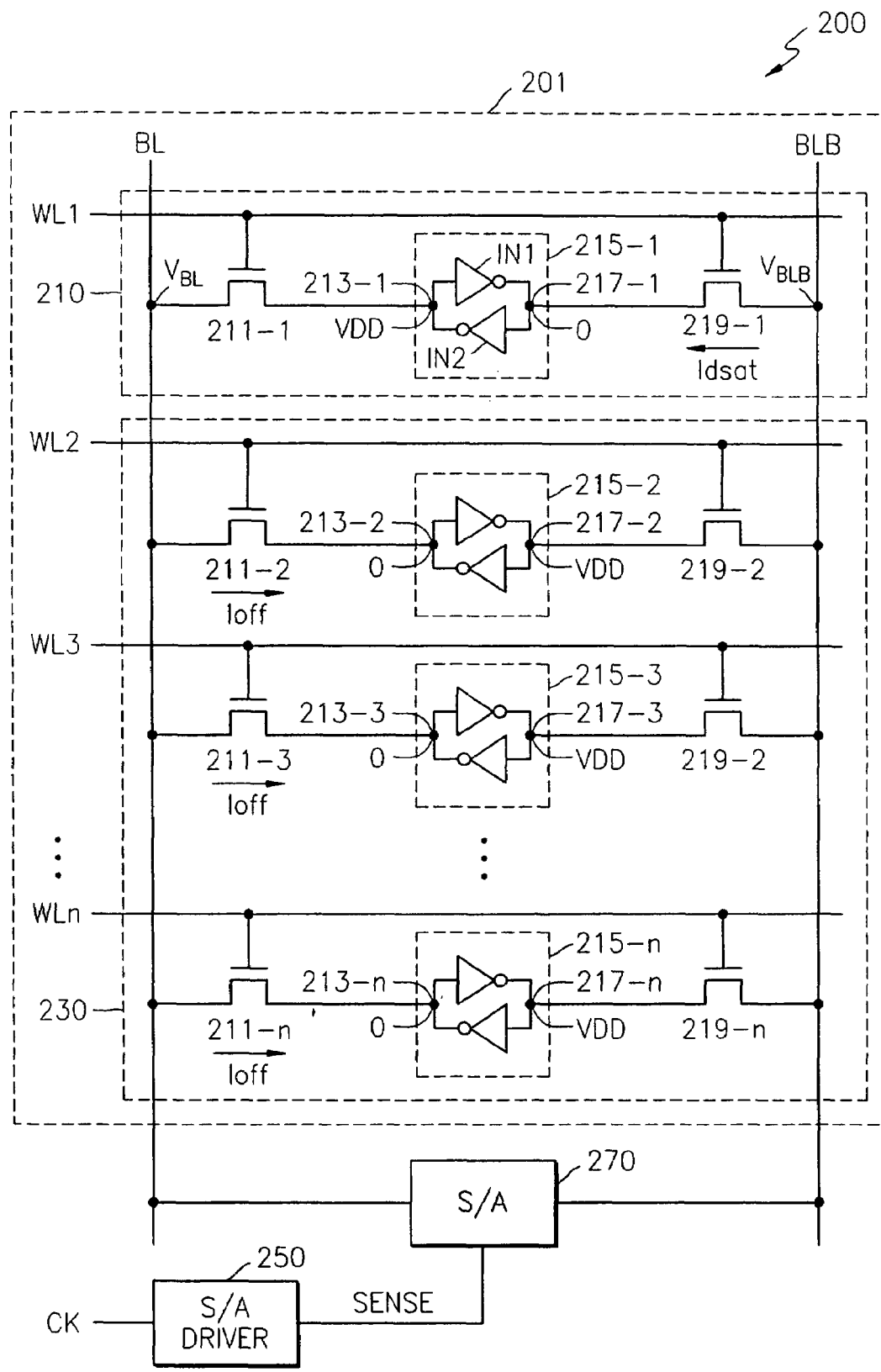
FIG. 2 is a block diagram of a semiconductor device having a conventional sense amplifier driver.

FIG. 2 is a block diagram of a semiconductor device 200 having a conventional sense amplifier driver. With reference to FIG. 2, the semiconductor device 200 includes a memory cell array 201, a sense amplifier driver 250, and a sense amplifier 270.

The memory cell array 201 includes a first memory block 210 and a second memory block 230. The memory cell array 201 includes a plurality of transistors 211-1, 211-2, ..., 211-n; 219-1, 219-2, ..., 219-n; and a plurality of data storing circuits 215-1, 215-2, ..., 215-n, where n is a natural number.

The memory cell array 201 is assumed to be a type most highly affected by off current in a row direction.

Each of data storing circuits 215-1, 215-2, ..., 215-n is realized by a latch made up of two inverters. Each inverter is realized by a complementary MOS (CMOS) inverter made up of one PMOS transistor and one NMOS transistor which are connected in series.

The sense amplifier driver 250 receives a clock signal CK and generates a sense amplifier enable signal SENSE in order to enable the sense amplifier 270 after a predetermined time has passed.

The sense amplifier 270 senses a voltage difference between a bit line BL and a complementary bit line BLB in response to the sense amplifier enable signal SENSE and amplifies the voltage difference.

For example, it is assumed that both of voltage $V_{BL}$ of the bit line BL and voltage $V_{BLB}$ of the complementary bit line BLB are precharged to the power supply voltage VDD, the voltage of each of nodes 217-1, 213-2, 213-3, ..., 213-n is 0V, and the voltage of each of nodes 213-1, 217-2, 217-3, ..., 217-n is the power supply voltage VDD.

If only the word line WL1 of a plurality of word lines WL1, WL2, WL3, ..., WLn is activated, the voltage $V_{BLB}$ of the complementary bit line BLB is expressed by Equation 1.

$$V_{BLB}=VDD-\Delta V1 \quad \text{[Equation 1]}$$

where $\Delta V1$ is the voltage drop of the transistor 219-1 due to the on current Idsat. The on current Idsat flows toward the ground voltage through the transistor 219-1 and an NMOS transistor of an inverter IN1. Therefore, the amount of voltage drop AV1 is determined by the on current Idsat.

Also, the voltage $V_{BL}$ of the bit line BL is expressed by Equation 2.

$$V_{BL}=VDD-\Delta V2 \quad \text{[Equation 2]}$$

where $\Delta V2$ is the voltage drop of the transistors 211-2, 211-3, ..., 211-n due to the off current Ioff. It is assumed that the amount of each off current Ioff flowing through transistors 211-2, 211-3, ..., 211-n of the second memory block 230 is the same.

The off current flows toward the ground voltage through each of transistors 211-2, 211-3, ..., 211-n and an NMOS transistor of each inverter IN2. Therefore, the level of $\Delta V2$ is determined by the off current off. Here, the first memory block 210 is an activated block and the second memory block 230 is a deactivated block.

The sense amplifier driver 250 generates the sense amplifier enable signal SENSE when a voltage difference VD expressed by Equation 3 is generated between the voltage $V_{BL}$ of the bit line BL and the voltage $V_{BLB}$ of the complementary bit line BLB after the word line WL1 is activated.

$$VD=V_{BL}-V_{BLB}=\Delta V1-\Delta V2 \quad \text{[Equation 3]}$$

Therefore, the performance of a semiconductor device (for example, data access time) is determined by the time required to generate the voltage difference VD. The voltage difference VD is the amplifying margin of the semiconductor device.

In a case where a transistor is manufactured using deep submicron technology, when the threshold voltage of the transistor decreases, the on current Idsat increases and, simultaneously, the off current Ioff also increases. Accordingly, in a high manufacturing temperature and fast manufacturing process, since the off current Ioff increases by a proportionately larger amount than the on current Idsat does, the time taken to generate the voltage difference VD is longer. Therefore, the amplifying margin of a semiconductor device having transistors manufactured under the high manufacturing temperature and fast manufacturing process decreases.

Figure 3:
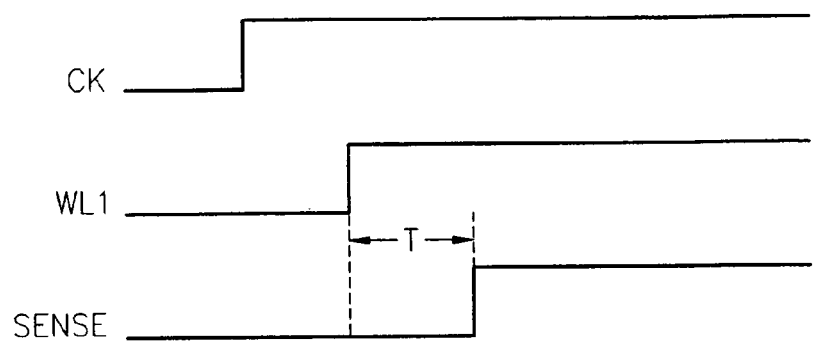
FIG. 3 is a timing diagram showing an input/output waveform of the sense amplifier driver of FIG. 2.

FIG. 3 is a timing diagram showing an input/output waveform of the sense amplifier driver of FIG. 2. With reference to FIG. 3, the time T shows the time required from activation of the word line WL1 to activation of the sense amplifier enable signal SENSE. The time T, which is a constant value, is determined by a manufacturer of a semiconductor device.

For example, if the time T required to generate the voltage difference VD of 100 mV is 100 ms, even if the time T increases to 150 ms due to an increase of the off current, the conventional sense amplifier enable signal SENSE is unconditionally activated 100 ms after activation of the word line WL1. At this time, since the sense amplifier 270 is activated in a state where the voltage $V_{BL}$ of the bit line BL and the voltage $V_{BLB}$ of the complementary bit line BLB are not sufficiently evaluated, the sense amplifier 270 may not exactly detect data on the bit line BL and data on the complementary bit line BLB. Therefore, the performance of the sense amplifier 270 may be lower.

Figure 4:
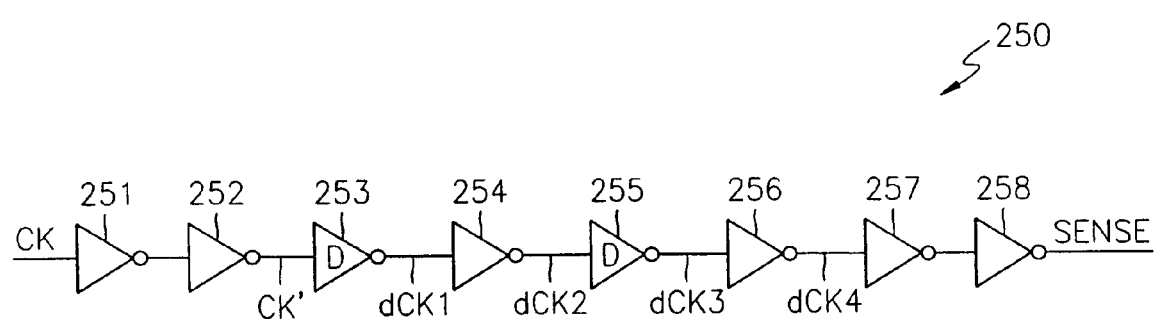
FIG. 4 is a block diagram of the sense amplifier driver of FIG. 2.

FIG. 4 is a block diagram of the sense amplifier driver of FIG. 2. With reference to FIG. 4, the sense amplifier driver 250 includes a plurality of inverters 251 through 258 connected in series and generates the sense amplifier enable signal SENSE by buffering the clock signal CK. Two inverters 253 and 255 delay transition time from logic high to logic low by a predetermined time and output the delayed signals at their output terminals. The delay time is determined when the inverters 253 and 255 are manufactured.

Figure 5:
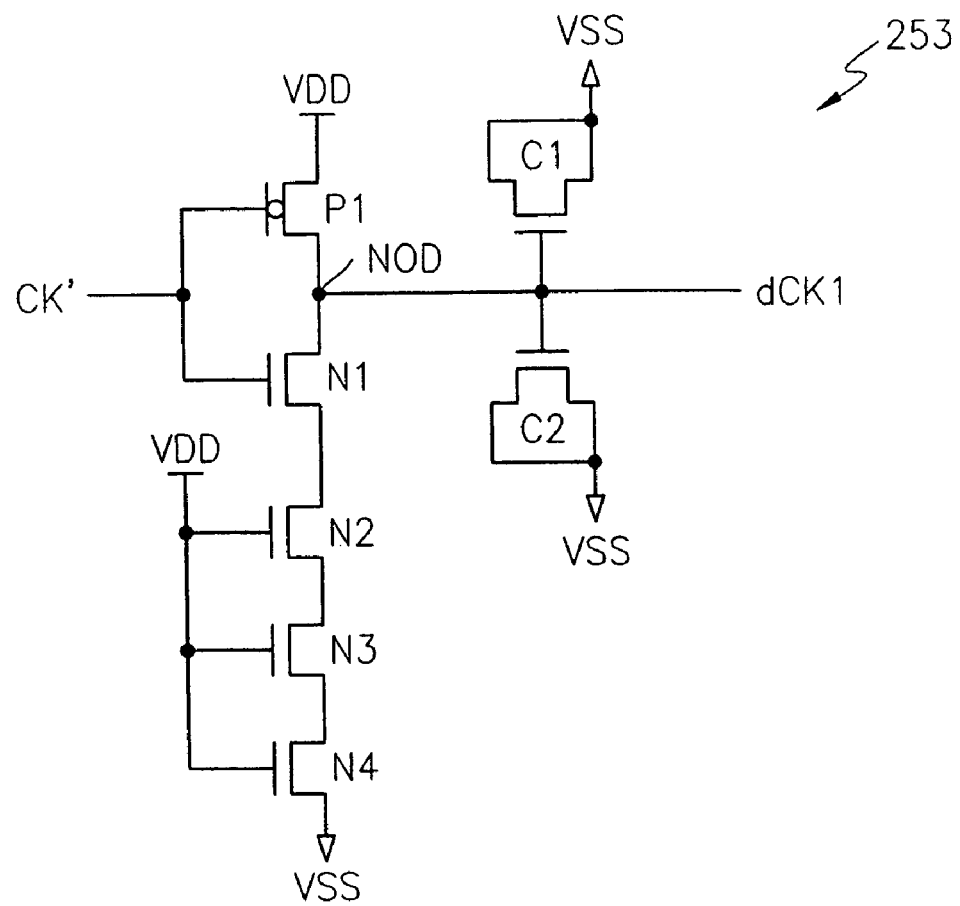
FIG. 5 is a detailed circuit diagram of each of the inverters shown in FIG. 4.

FIG. 5 is a detailed circuit diagram of each of inverters 253 and 255 shown in FIG. 4. With reference to FIGS. 4 and 5, an input signal CK' is input to the gate of a PMOS transistor P1 and the gate of an NMOS transistor N1 and a plurality of transistors P1, N1, N2, N3, and N4 are connected in series between the power supply voltage VDD and the ground voltage VSS. Also, the power supply voltage VDD is input to the gates of the transistors N2, N3, and N4. Each of capacitors C1 and C2 realized by an NMOS transistor is connected to the output terminal NOD of the inverter 253. Therefore, the transition time from logic high to logic low is determined by the turn-on resistances of the NMOS transistors N2, N3, and N4 connected in series and the capacitance of the capacitors C1 and C2.

Figure 6:
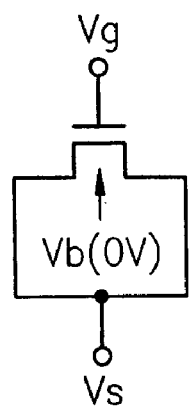
FIG. 6 is a diagram of a MOS capacitor realized by a MOS transistor.

FIG. 6 is a MOS capacitor realized by a MOS transistor. With reference to FIG. 6, the drain and source of the NMOS transistor are connected to each other. If the gate of the NMOS transistor is used as a node for evaluation, RC delay is generated in the evaluation of the gate of the NMOS transistor due to the influence of capacitance between the gate and source of the NMOS transistor and capacitance between the gate and drain of the NMOS transistor.

Figure 7:
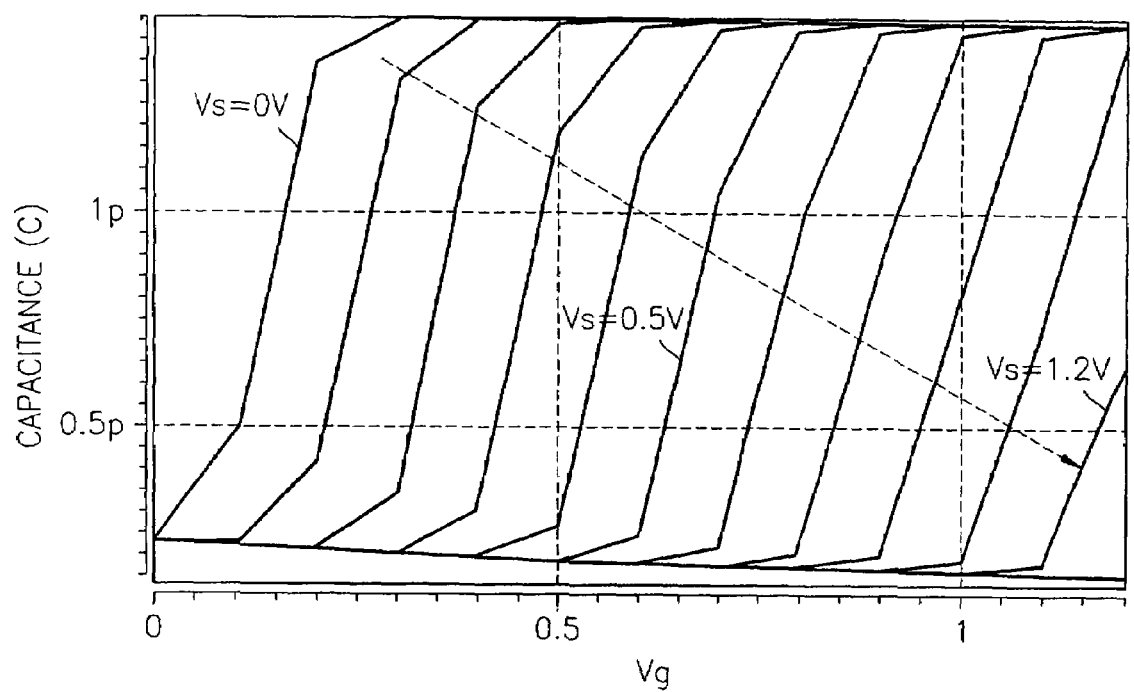
FIG. 7 is a simulation graph showing changes in the MOS capacitance with respect to changes in the gate/source voltage of the MOS capacitor of FIG. 6.

FIG. 7 is a simulation graph showing changes in the MOS capacitance with respect to changes in the gate/source voltage of the MOS capacitor of FIG. 6. With reference to FIGS. 6 and 7, when the source voltage Vs is constant, the larger the gate voltage Vg, the larger the capacitance C of the NMOS capacitor. Also, when the gate voltage Vg is constant, the smaller the source voltage Vs, the larger the capacitance C of the NMOS capacitor.

Figure 8:
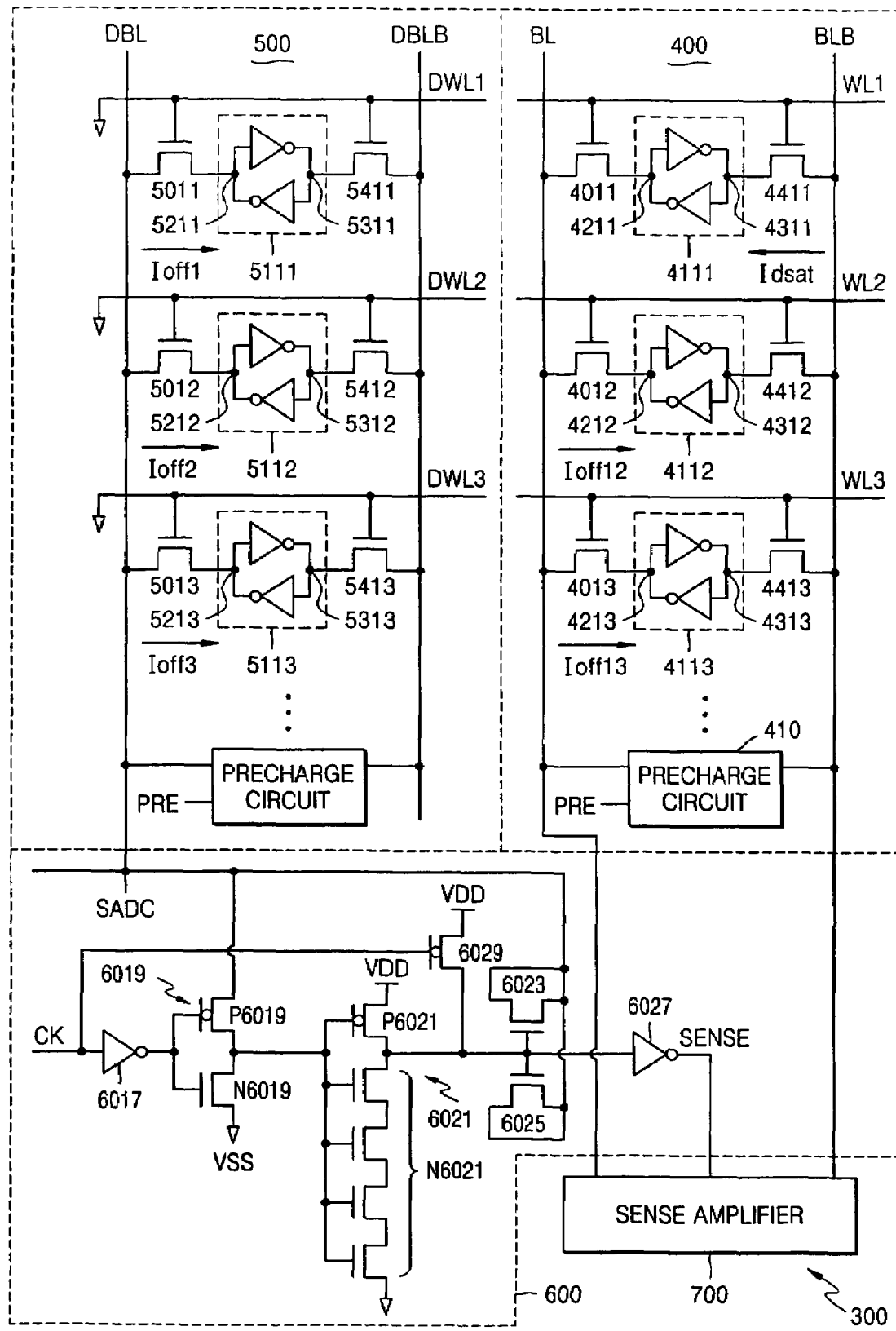
FIG. 8 is a schematic block diagram of a semiconductor device having a sense amplifier driver with a MOS capacitor affected by off current according to an embodiment of the present invention.

FIG. 8 is a semiconductor device 300 having a sense amplifier driver 600 with a MOS capacitor affected by off current according to an embodiment of the present invention. With reference to FIG. 8, at least one of MOS capacitors 6023 and 6025 is connected between a dummy bit line DBL and the output terminal of an inverter 6021.

The semiconductor device 300 includes a memory cell array 400, a dummy memory cell array 500, the sense amplifier driver 600, and a sense amplifier 700.

The memory cell array 400 shows only memory cells connected to one bit line BL and one complementary bit line BLB for convenience of description. The memory cells are realized by storing circuits 4111, 4112, 4113, . . . made up of inverters. A precharge circuit 410 is connected between the bit line BL and the complementary bit line BLB and precharges the bit line BL and the complementary bit line BLB to a predetermined voltage in response to a precharge control signal PRE.

The voltage of each of nodes 4211, 4312, and 4313 is the power supply voltage VDD and the voltage of each of nodes 4311, 4212, and 4213 is the ground voltage VSS. The on current Idsat flows through a transistor 4411 and the off currents Ioff12, Ioff13, . . . flow through transistors 4012, 4013, . . . , respectively. At this time, it is assumed that only the word line WL1 is activated.

The dummy memory cell array 500 includes a dummy bit line DBL, a complementary dummy bit line DBLB, a plurality of dummy word lines DWL1, DWL2, DWL3, . . . , a plurality of transistors 5011, 5012, 5013, . . . and 5411, 5412, 5413, . . . , and a plurality of memory cells 5111, 5112, 5113, . . . .

Each of the plurality of dummy word lines DWL1, DWL2, DWL3, . . . is connected to the ground voltage VSS. The dummy bit line DBL and the complementary dummy bit line DBLB are precharged to the power supply voltage VDD in a case where the semiconductor device 300 executes a precharge operation.

The voltage of each of nodes 5211, 5212, 5213, . . . is 0V and the voltage of each of nodes 5311, 5312, 5313, . . . is the power supply voltage VDD. Each of the off currents Ioff1, Ioff2, Ioff3, . . . flows through each of the transistors 5011, 5012, 5013, . . . , respectively, connected to the dummy bit line DBL.

The gates of the transistors 5011, 5012, 5013, . . . are connected to the corresponding dummy word lines DWL1, DWL2, DWL3, . . . , respectively. The transistors 5011, 5012, 5013, . . . are connected between the dummy bit line DBL and the nodes 5211, 5212, 5213, . . . , respectively.

The voltage SADC of the dummy bit line DBL is determined by the voltage drop due to the off currents Ioff1, Ioff2, Ioff3, . . . flowing through the transistors 5011, 5012, 5013, . . . That is, the voltage SADC of the dummy bit line DBL is expressed by Equation 4.

$$SADC = VDD - \Delta V3 \quad \text{[Equation 4]}$$

where $\Delta V3$ is the voltage drop due to the sum of the off currents Ioff1, Ioff2, Ioff3, . . . flowing through the transistors 5011, 5012, 5013, . . . It is preferable that $\Delta V3$ is actually the same as or similar to $\Delta V2$.

The sense amplifier driver 600 receives a clock signal CK, performs buffering of the clock signal CK, and controls the active timing of the sense amplifier enable signal SENSE to enable the sense amplifier 700 based on the voltage SADC of the dummy bit line DBL.

The sense amplifier driver 600 includes a plurality of inverters 6017, 6019, 6021, and 6027 connected in series, a power supply circuit 6029, and at least one of the capacitors 6023, 6025.

It is preferable that at least one first inverter 6019 of the plurality of inverters swings between the ground voltage VSS and the voltage SADC of the dummy bit line DBL. That is, a PMOS transistor P6019 is connected between the dummy bit line DBL and the output terminal of the first inverter 6019 and an NMOS transistor N6019 is connected between the output terminal of the first inverter 6019 and the ground voltage VSS. Therefore, a full up level of the output terminal of the inverter 6019 is the voltage SADC of the dummy bit line DBL.

The second inverter 6021 includes a PMOS transistor P6021 and a group of transistors N6021. The group of transistors N6021 includes a plurality of NMOS transistors connected in series. The PMOS transistor P6021 is connected between the power supply voltage VDD and the output terminal of the inverter 6021 and the group of transistors N6021 is connected between the output terminal of the inverter 6021 and the ground voltage VSS.

The group of transistors N6021 delays the transition time from logic high to logic low and the number of the NMOS transistors N6021 connected in series can be changed depending on the required characteristics.

The power supply circuit 6029 is realized by a PMOS transistor 6029. The PMOS transistor 6029 is connected between the power supply voltage VDD and the output terminal of the inverter 6021 and the clock signal CK is input to the gate of the PMOS transistor 6029. The PMOS transistor 6029 pulls up the output terminal of the inverter 6021 to the power supply voltage VDD based on a state of the clock signal CK.

It is preferable that the ratio of the channel width to the channel length of the PMOS transistor P6021 is much smaller than the ratio of the channel width to the channel length of the PMOS transistor 6029.

The source and drain of the NMOS transistor 6023 are connected to the dummy bit line DBL, and the gate of the NMOS transistor 6023 is connected to the output terminal of the second inverter 6021. Therefore, the NMOS capacitor 6023 is connected between the dummy bit line DBL and the output terminal of the second inverter 6021 and forms a MOS capacitor.

The source and drain of the NMOS transistor 6025 are connected to the dummy bit line DBL, and the gate of the NMOS transistor 6025 is connected to the output terminal of the second inverter 6021. Therefore, the NMOS capacitor 6025 is connected between the dummy bit line DBL and the output terminal of the second inverter 6021 and forms a MOS capacitor.

The inverter 6027 receives an output signal of the inverter 6021 and generates the sense amplifier enable signal SENSE by inverting the output signal of the inverter 6021. The transition time of the output signal SENSE of the inverter 6027 from logic low to logic high is considerably affected by the group of transistors N6021 and capacitance of the two capacitors 6023 and 6025 connected to the output terminal of the second inverter 6021.

The sense amplifier 700 senses a voltage difference between the bit line BL and the complementary bit line BLB in response to the sense amplifier enable signal SENSE and amplifies the voltage difference.

It is assumed that the voltage SADC of the dummy bit line DBL is precharged to the power supply voltage VDD in a precharge step.

In a case where the voltage SADC of the dummy bit line DBL is rarely affected by the off current in an evaluation step (for example, a low manufacturing temperature and slow manufacturing process), since the voltage SADC of the dummy bit line DBL remains at the power supply voltage VDD, the capacitance of each of the capacitors 6023 and 6025 is lower. Therefore, when the clock signal CK transits from logic low to logic high, the output signal of the second inverter 6021 quickly transits (or evaluates) from logic high to logic low.

However, in a case where the voltage SADC of the dummy bit line DBL is considerably affected by the off current in the evaluation step (for example, a high the dummy bit line DBL decreases to a lower voltage than the power supply voltage VDD, the capacitance of each of the capacitors 6023, 6025 is larger. Therefore, when the clock signal CK transits from logic low to logic high, the output signal of the second inverter 6021 slowly transits from logic high to logic low.

That is, the larger of each of the off currents Ioff1, Ioff2, Ioff3, . . . flowing through each of the transistors 5011, 5012, 5013, . . . , the smaller the voltage SADC of the dummy bit line DBL becomes with respect to the power supply voltage VDD. Also, the larger of each of the off currents Ioff1, Ioff2, Ioff3, . . . flowing through each of the transistors 5011, 5012, 5013, . . . , the larger the capacitance of each of the capacitors 6023, 6025. Therefore, the transition (or evaluation) time of the output signal of the second inverter 6021 from logic high to logic low is longer.

Therefore, the time taken to buffer the clock signal CK in the sense amplifier driver 600 is proportional to the sum of each of the off currents Ioff1, Ioff2, Ioff3, . . . flowing through each of the transistors 5011, 5012, 5013, . . . .

Therefore, the sense amplifier driver 600 according to the present invention can enable the sense amplifier enable signal SENSE after 150 ms if the time required to generate a voltage difference of 100 mV is 100 ms–150 ms longer due to an increase of the off currents Ioff12, Ioff13, . . . flowing through the bit line BL.

Since the sense amplifier 700 is activated in response to the sense amplifier enable signal SENSE after the voltage $V_{BL}$ of the bit line BL and the voltage $V_{BLB}$ of the complementary bit line BLB are evaluated to the voltage enough to satisfy the specification, the sense amplifier 700 can exactly detect data of the bit line BL and data of the complementary bit line BLB. Therefore, an amplifying margin of the sense amplifier 700 increases.

Figures 9, 10:
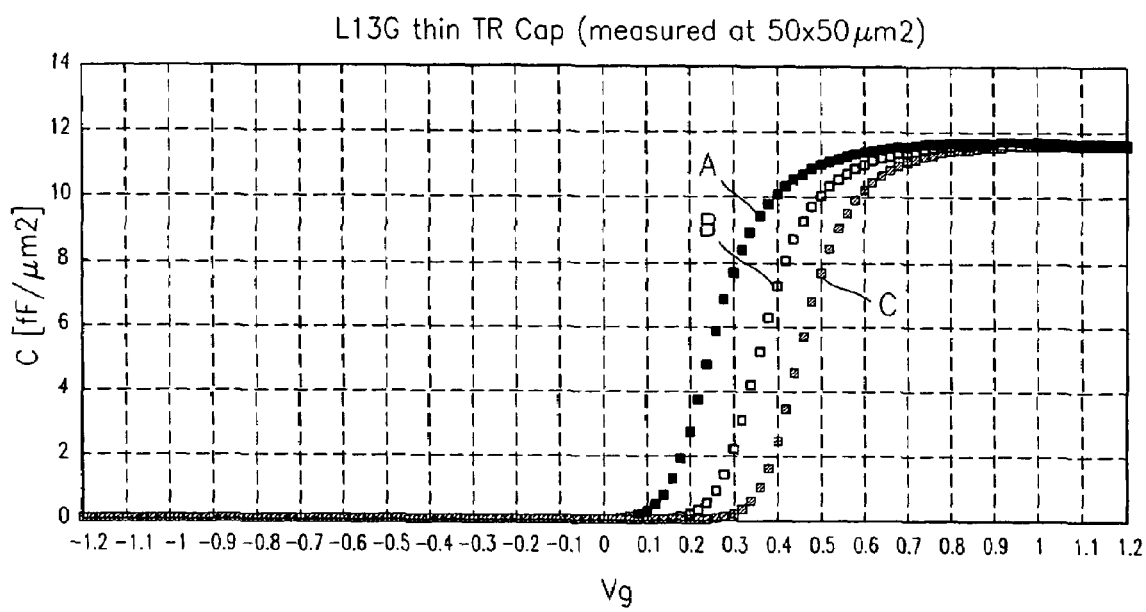
FIG. 9 is a graph which shows changes in MOS capacitance according to changes in gate/source voltage of the MOS capacitor of FIG. 6 fabricated with silicon.
FIG. 10 is a table showing ratios of MOS capacitance according to changes in the gate/source voltage of the MOS capacitor of FIG. 6.

FIG. 9 shows changes in MOS capacitance according to changes in gate/source voltage of the MOS capacitor of FIG. 6 fabricated with silicon. With reference to FIGS. 6 and 9, a curve A shows changes in the magnitude of the capacitance according to changes in the gate voltage Vg when the source voltage, the drain voltage, and substrate voltage Vb are all the ground voltage.

A curve B shows changes in the magnitude of the capacitance according to changes in the gate voltage Vg when the source voltage and the drain voltage are each 0.6V and the substrate voltage Vb is the ground voltage or when the source voltage and the drain voltage are both of the ground voltage and the substrate voltage Vb is −0.6V.

A curve C shows changes in the magnitude of the capacitance according to changes in the gate voltage Vg when the source voltage and the drain voltage are each 1.2V and the substrate voltage Vb is at the ground voltage or when the source voltage and the drain voltage are both of the ground voltage and the substrate voltage Vb is −1.2V.

In a case where the gate voltage Vg is 0.4V through 0.6V, the capacitance of each of the capacitors 6023 and 6025 shown in FIG. 8 is dramatically changed according to the source voltage.

FIG. 10 is a table showing ratios of MOS capacitance according to changes in the gate/source voltage of the MOS capacitor of FIG. 6. With reference to FIGS. 6, 8, and 10, when the source voltage Vs is 1.2V and the gate voltage Vg is 0.4V, the capacitance MOSC is 2 fF. When the source voltage Vs is 0.6V and the gate voltage Vg is 0.4V, the capacitance MOSC is 6.5 fF. Therefore, if 2 fF is 100%, 6.5 fF is 325%.

Also, when the source voltage Vs is 1.2V and the gate voltage Vg is 0.5V, the capacitance MOSC is 8 fF. When the source voltage Vs is 0.6V and the gate voltage Vg is 0.5V, the capacitance MOSC is 10 fF. Therefore, if 8 fF is 100%, 10 fF is 125%.

As described above, the capacitance of the NMOS capacitor according to the present invention changes according to the magnitude of the off current. Therefore, the sense amplifier driver having the NMOS capacitor can delay the active timing of the sense amplifier enable signal according to the magnitude of the off current.

Therefore, since the sense amplifier driver can control the active timing of the sense amplifier enable signal according to the magnitude of the off current, the performance of the sense amplifier enabled in response to the sense amplifier enable signal is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a sense amplifier for sensing a voltage difference between a bit line and a complementary bit line;
   a sense amplifier driver for receiving a clock signal and generating a sense amplifier enable signal by buffering the clock signal, in order to enable the sense amplifier; and
   a dummy bit line where voltage drop is generated due to an amount of off current of at least one transistor,
   wherein the sense amplifier driver includes:
   a plurality of inverters connected in series; and
   at least one capacitor,
   wherein at least a first inverter of the plurality of inverters connected in series outputs a signal swinging between a voltage of the dummy bit line and a ground voltage, and
   the at least one capacitor is connected between the dummy bit line and an output terminal of a second inverter which inverts an output signal of the first inverter.

2. The semiconductor device of claim 1, wherein the first inverter is made up of a PMOS transistor and an NMOS transistor connected in series,
   the PMOS transistor is connected between the dummy bit line and the output terminal of the first inverter, and the NMOS transistor is connected between the output terminal of the first inverter and the ground voltage.

3. The semiconductor device of claim 1, wherein the time taken for the voltage of the output terminal of the second inverter to transit from a power supply voltage to the ground voltage is determined by the capacitance of the capacitor.

4. The semiconductor device of claim 1, wherein the capacitor is implemented with an NMOS transistor.

* * * * *